US012325917B2

(12) United States Patent
Jin et al.

(10) Patent No.: US 12,325,917 B2
(45) Date of Patent: Jun. 10, 2025

(54) RECIPROCATING ROTARY CVD EQUIPMENT AND APPLICATION METHOD

(71) Applicant: BETONE TECHNOLOGY SHANGHAI, INC., Shanghai (CN)

(72) Inventors: Xiaoliang Jin, San Jose, CA (US); Waleyweitsung Sung, San Jose, CA (US); Zhongyun Li, Shanghai (CN)

(73) Assignee: BETONE TECHNOLOGY SHANGHAI, INC., Shanghai (CN)

( * ) Notice: Subject to any disclaimer, the term of this patent is extended or adjusted under 35 U.S.C. 154(b) by 136 days.

(21) Appl. No.: 17/386,191

(22) Filed: Jul. 27, 2021

(65) Prior Publication Data

US 2022/0025516 A1 Jan. 27, 2022

(30) Foreign Application Priority Data

May 27, 2020 (CN) .......................... 202010458535.9

(51) Int. Cl.
*C23C 16/458* (2006.01)
*C23C 16/505* (2006.01)

(52) U.S. Cl.
CPC ...... *C23C 16/4584* (2013.01); *C23C 16/4586* (2013.01); *C23C 16/505* (2013.01)

(58) Field of Classification Search
CPC ............ C23C 16/4584; C23C 16/4586; C23C 16/505
USPC ...................................................... 118/725
See application file for complete search history.

(56) References Cited

U.S. PATENT DOCUMENTS

| 3,983,402 | A | * | 9/1976 | Arndt, Jr. | ............ | H01J 37/3171 |
| | | | | | | 250/441.11 |
| 4,821,674 | A | * | 4/1989 | deBoer | ............ | H01L 21/67248 |
| | | | | | | 118/696 |
| 5,062,386 | A | * | 11/1991 | Christensen | ...... | C23C 16/45574 |
| | | | | | | 118/724 |
| 6,235,121 | B1 | * | 5/2001 | Honma | ............ | H01L 21/67126 |
| | | | | | | 118/724 |
| 6,797,068 | B1 | * | 9/2004 | Yamasaki | ........... | C23C 16/4585 |
| | | | | | | 156/345.52 |
| 2002/0050246 | A1 | * | 5/2002 | Parkhe | ............ | H01L 21/67109 |
| | | | | | | 118/500 |

(Continued)

*Primary Examiner* — Charlee J. C. Bennett
(74) *Attorney, Agent, or Firm* — Global IP Services; Tianhua Gu (57) ABSTRACT

A reciprocating rotary CVD apparatus and a method for applying same. The reciprocating rotary CVD apparatus includes a cavity, a wafer heating base, a rotating apparatus. The rotating apparatus is located outside the cavity and includes a rotating power mechanism and a rotating sealing mechanism, and the rotating sealing mechanism includes a rotating member and a fixed member; the fixed member is fixedly and hermetically connected to the cavity, the rotating member is fixedly and hermetically connected to the wafer heating base, the rotating member is movably and hermetically connected to the fixed member, and the rotating member is connected to the rotating power mechanism, to drive, by using the rotating power mechanism, the rotating member and the wafer heating base to perform reciprocating rotation. In the present invention, the rotating apparatus rotates, to improve the uniformity of thin film deposition in a circumferential direction of a wafer.

7 Claims, 6 Drawing Sheets

(56) References Cited

U.S. PATENT DOCUMENTS

| | | | |
|---|---|---|---|
| 2005/0184254 A1* | 8/2005 | Matsumoto | H01J 37/3171 |
| | | | 257/E21.334 |
| 2011/0147363 A1* | 6/2011 | Yap | H01L 21/68792 |
| | | | 219/385 |
| 2014/0263275 A1* | 9/2014 | Nguyen | G01K 13/08 |
| | | | 374/179 |
| 2017/0037907 A1* | 2/2017 | Nakamura | F16C 39/04 |
| 2019/0161852 A1* | 5/2019 | Park | C23C 14/54 |
| 2020/0355247 A1* | 11/2020 | Rhee | B24B 37/04 |
| 2021/0398844 A1* | 12/2021 | Rhee | C23C 16/4584 |

* cited by examiner

RECIPROCATING ROTARY CVD EQUIPMENT AND APPLICATION METHOD

CROSS REFERENCE TO RELATED APPLICATION

The present application claims the benefit of priority to Chinese Patent Application No. CN 2020104585359, entitled "RECIPROCATING ROTARY CVD APPARATUS AND METHOD FOR APPLYING SAME", filed with CNIPA on May 27, 2020, the disclosure of which is incorporated herein by reference in its entirety for all purposes.

BACKGROUND OF THE PRESENT INVENTION

Field of Invention

The present invention belongs to the field of chemical vapor deposition technologies and semiconductor apparatus manufacturing, and specifically relates to a reciprocating rotary chemical vapor deposition (CVD) apparatus and a method for applying same.

Description of Related Arts

Chemical vapor deposition (CVD) is a technology widely used in a semiconductor industry and used for depositing a thin film, and a CVD apparatus includes a reaction cavity and a wafer heating base. When two or more gaseous raw materials are introduced into the reaction cavity, the gaseous raw materials react chemically with each other, to form a new material, and the new material is deposited on a surface of the wafer heating base to form a deposited thin film.

With the development of vapor deposition technologies, functions of the CVD apparatus become more mature and perfect. To adapt to constant pursuits of a high-quality, high-efficiency, low-cost, and large-size wafer (for example, a size of the wafer is 300 mm) process in the current semiconductor industry, it is particularly important to improve the uniformity of a CVD thin film deposited on the wafer, and a process of obtaining a high-quality deposited thin film with good uniformity is relatively complex. Factors such as the flowing direction and distribution of reactive gases in the reaction cavity, pressure distribution in the reaction cavity, a condition of a heating temperature field of the wafer, a flowing direction of a gas exhausted from the reaction cavity, and intensity, distribution, and range of influence of a plasma applied to the reaction cavity affect the speed of depositing a thin film on a surface of the wafer, components of the deposited thin film, and properties of the deposited thin film. The non-uniformity of distribution of parameters in the reaction cavity causes undesirable phenomena of non-uniform thickness, non-uniform components, non-uniform physical properties, and the like on the thin film deposited on the surface of the wafer. Consequently, various states in the reaction cavity are not consistent, including design, for example, a transfer channel of the wafer is on a local position of a cavity and gas exhaust channels are non-uniformly distributed on the cavity, manufacturing, and assembly, for example, centers of various components in the reaction cavity cannot be perfectly aligned during actual equipment assembly.

During thin film deposition, because a wafer on which a thin film is to be deposited is placed on a base, if the base can rotate around a central axis, the wafer also rotates along with the base, so that an average effect of thin film deposition can be obtained in a circumferential direction of the wafer. Therefore, a difference in thin film deposition caused by a difference in local conditions at portions inside the reaction cavity can be eliminated, and rotation of the wafer is a relatively efficient method for improving the uniformity of the deposited thin film on the wafer. A challenge on the technical application needs to be resolved for rotating the base, for example, a heating current needs to be inputted into a common resistance wafer heating base, and a temperature change during heating needs to be measured in real time. Therefore, connecting power lines and temperature measurement thermocouple lines are indispensable. The bottom of the wafer heating base usually needs to be sealed with an o-ring, and to ensure the reliability of the sealing, a cooling channel such as a water-cooling channel needs to be disposed on the wafer heating base. Therefore, connecting a water inlet pipe and a water outlet pipe is indispensable. After the wafer heating base rotates, wires and the cooling water pipes that are connected to the wafer heating base are wound.

To resolve the problem that the wire and the cooling channel that are connected to the wafer heating base are wound, the wafer heating base may be connected to the wire in a sliding connection manner, and the wafer heating base may be connected to the cooling channel in a rotation connection manner. However, such connection manners lead to a complex apparatus structure, increase apparatus costs, and bring new problems such as low electrical connection reliability and low temperature measurement accuracy. For example, the electrical contact may become unreliable along with the wear/oxidation of a contact surface, a contact resistance may be changed along with a magnitude of a spring contact force, and electrical shielding may not be well performed to generate/receive an interference signal. Especially for a plasma-enhanced chemical vapor deposition (PECVD) apparatus, stable operation of radio frequency-excited plasma is critical. As an electrode, the wafer heating base needs to satisfy reliable grounding for high frequency and high power radio frequency, so that if the wafer heating base is connected in a sliding connection manner, adverse impact is caused to the reliable electrical connection required by a radio frequency system.

If a rotary CVD apparatus is designed by separating a heater of the wafer heating base from the base, that is, the heater is designed to be fixed in a position, and the base is designed to be rotatable, so that a power wire of the heater is not wound due to rotation. However, because the heater is not wrapped in the base, the heater is inevitably exposed to various chemical reactive gases during thin film deposition in the cavity and a cleaning gas used for cleaning the cavity, and these corrosive gases are very disadvantageous to the life time of the heater. If the base is raised to adjust the position of the wafer, the distance between the base and the heater will increase, and the temperature of the base decreases with the increase of the distance. In this case, the temperature of the heater is changed depending on signal feedback of the thermocouple on the base for temperature compensation. As a result, the time of the entire adjustment process is increased, and the speed of thin film deposition is affected. Because the temperature of the base needs to be measured, if the thermocouple is placed on the base, the thermocouple wire is wound due to rotation of the base, and if the thermocouple is not in direct contact with the base, the wire is not wound but there is a new problem of the accuracy of temperature measurement.

Therefore, it is necessary to provide a reciprocating rotary CVD apparatus and a method for applying same to obtain a high-quality deposited thin film with good uniformity on the surface of the wafer.

SUMMARY OF THE PRESENT INVENTION

In view of the above disadvantages of the prior art, the present invention is intended to provide a reciprocating rotary CVD apparatus and a method for applying same. During thin film deposition, the uniformity of thin film deposition in a circumferential direction of a wafer can be improved through reciprocating rotation of a rotating apparatus. For electrical connection, a fixed wire connection is still used instead of a sliding connection manner, and for connection of a cooling channel, a fixed channel connection is still used instead of a rotation connection manner. Therefore, the sliding/rotating connection is avoided, so that the structure of the apparatus can be simplified, the mounting space is saved, the reliability of the apparatus is ensured, the costs of the apparatus are reduced, and the mounting and the maintenance of the apparatus are convenient. According to the present invention, a problem that it is difficult for the CVD apparatus to obtain a high-quality deposited thin film with good uniformity on the wafer surface may be resolved. To achieve the above objectives and other related objectives, the present invention provides a reciprocating rotary CVD apparatus, comprising:

- a cavity, a wafer heating base, and a rotating apparatus, where the wafer heating base is located in the cavity and a range of an angle θ by which the wafer heating base performs reciprocating rotation is greater than 0° and less than or equal to 360°; a manner in which the wafer heating base performs the reciprocating rotation comprises: clockwise rotating by an angle θ1 from a starting position, then counterclockwise rotating by an angle θ2, and returning to the starting position through reciprocating rotation for N times, N being greater than or equal to 1; or counterclockwise rotating by an angle θ1 from a starting position, then clockwise rotating by an angle θ2, and returning to the starting position through reciprocating rotation for N times, N being greater than or equal to 1, and the rotational speed during the reciprocating rotation is independently controlled; the rotating apparatus is located outside the cavity and comprises a rotating power mechanism and a rotating sealing mechanism, and the rotating sealing mechanism comprises a rotating member and a fixed member; and the fixed member is fixedly and hermetically connected to the cavity, the rotating member is fixedly and hermetically connected to the wafer heating base, the rotating member is movably and hermetically connected to the fixed member, the movable sealing refers to being isolated from reactive gases in the cavity, and the rotating member is connected to the rotating power mechanism, to drive, by using the rotating power mechanism, the rotating member and the wafer heating base to perform reciprocating rotation.

Optionally, the rotating sealing mechanism is a magnetic fluid rotating sealing mechanism and also covers common rotating sealing mechanisms such as a magnetic coupling rotating sealing mechanism and a sealing ring rotating sealing mechanism.

Optionally, the rotating member is movably connected to the fixed member by a bearing, and the bearing comprises a radial bearing and an end face bearing, the rotating member comprises a first end, a second end, and a side wall located between the first end and the second end, and the rotating member comprises an internal cooling channel, where the first end is fixedly and hermetically connected to the wafer heating base, an inlet and an outlet of the internal cooling channel are located at the second end, and the internal cooling channel covers the first end and the side wall; and a cooling material introduced into the internal cooling channel comprises a cooling gas or a cooling liquid.

Optionally, the reciprocating rotary CVD apparatus further comprises a purge gas guide ring located in the cavity, a slit channel is formed between the purge gas guide ring and the wafer heating base, a range of a width W of the slit channel is greater than 0 mm and less than or equal to 1 mm, a range of a length L of the slit channel is greater than or equal to 5 mm, and a purge gas passing from the purge gas guide ring to the cavity through the rotating sealing mechanism and the slit channel is provided by using the purge gas guide ring.

Optionally, the purge gas guide ring further comprises uniform gas holes, and the uniform gas holes are uniformly distributed, so that the purge gas flows out and is uniformly distributed in a circumferential direction.

Optionally, the reciprocating rotary CVD apparatus further comprises a bellows hermetically connected to the cavity and the fixed member and a lifting power mechanism located outside the cavity and fixedly connected to the fixed member, where the lifting power mechanism comprises a driving motor and a transmission connecting member, and the driving motor comprises a servomotor.

Optionally, the rotating power mechanism comprises a driving motor and a transmission connecting member, the driving motor comprises a servomotor, and the transmission connecting member comprises a belt or gear.

Optionally, a component in the wafer heating base is connected to a corresponding component outside the cavity by a supply line, the supply line comprises a power line of a heater, a connecting line of a temperature measurement thermocouple, a ground line, a water pipe, and a gas pipe, and the supply line is led out from the bottom of the wafer heating base or an external connecting socket of the supply line is mounted at the bottom of the wafer heating base.

Optionally, the reciprocating rotary CVD apparatus comprises plasma-enhanced chemical vapor deposition (PECVD), sub-atmospheric chemical vapor deposition (SACVD), low-pressure chemical vapor deposition (LPCVD), and metal-organic chemical vapor deposition (MOCVD).

The present invention further provides a method for applying a reciprocating rotary CVD apparatus, comprising:
- providing the reciprocating rotary CVD apparatus according to any one of the foregoing; and
- placing a wafer on the wafer heating base, and performing synchronous reciprocating rotation on the wafer and the wafer heating base, to perform thin film deposition, where a range of an angle θ of the reciprocating rotation being less than 0° and greater than or equal to 360°.

The present invention further provides a method for applying a reciprocating rotary CVD apparatus, comprising:
- providing the reciprocating rotary CVD apparatus according to any one of the foregoing;
- placing a wafer on the wafer heating base, and performing synchronous reciprocating rotation on the wafer and the wafer heating base, to perform thin film deposition;
- during the thin film deposition, stopping the reciprocating rotation, separating the wafer and the wafer heating base, rotating the wafer heating base by an angle φ, and placing the wafer back onto the wafer heating base, so that the wafer and the wafer heating base deflect relative to each other by the angle φ, where a range of the angle φ is greater than 0° and less than or equal to 360°; and continuously performing synchronous reciprocating rotation on the wafer and the wafer heating base, to perform thin film deposition.

As described above, according to the reciprocating rotary CVD apparatus and the method for applying same consistent with the present invention, a rotating apparatus is comprised. During thin film deposition, the rotating apparatus rotates, to improve the uniformity of thin film deposition in a circumferential direction of a wafer; the wafer is rotated in a reciprocating manner within an optimal angle range through accurate control of a rotational speed, a rotation direction, and a rotation angle, and the reciprocating rotation angle is limited to be not more than 360°, to achieve the optimal thin film deposition uniformity; and through the reciprocating rotation of the rotating apparatus, the problems of electrical connection and cooling channel connection during rotation can be effectively resolved, and simple and reliable electrical connection and cooling connection are implemented.

According to the reciprocating rotary CVD apparatus and the method for applying same consistent with the present invention, a problem of non-uniform thin film deposition caused by design, manufacturing, mounting, debugging, and the like of a reaction cavity may be compensated, the design of the reaction cavity may be further simplified, and the manufacture/mounting/maintenance may become relatively easy, thereby improving the thin film deposition uniformity and further reducing the apparatus and wafer manufacturing costs.

DESCRIPTION OF REFERENCE NUMERALS OF ELEMENTS

101—cavity; 102—wafer heating base; 103—supply line; 104—channel valve; 105—wafer transfer channel; 106—throttle valve; 107—gas uniforming apparatus; 108—baffle ring; 109—bellows; 110—radio frequency power supply; 120—purge gas guide ring; 130—slit channel; 121—uniform gas hole; 201—driving motor; 202—rotating sealing mechanism; 2021—rotating member; 2022—fixed member; 2023—bearing; 20231—radial bearing; 20232—end face bearing; 2024—magnetic fluid; 2025—gap; 2026—fixed member support portion; 203—transmission connecting member; 204—internal cooling channel; 300—wafer; 401—reactive gas entering a reaction cavity; 402—material exiting the reaction cavity; 500—sealing ring; 600—flange; 700—lifting power mechanism; 801—purge entering gas; 802—purge exhaust gas; 901—inlet of the internal cooling channel; 902—outlet of the internal cooling channel; A—region; B—region; a—first end of the internal cooling channel; b—second end of the internal cooling channel; c—side wall of the internal cooling channel; R1—counterclockwise rotating; R2—clockwise rotating; O1—reference point; O2—reference point of the wafer heating base; and O3—reference point of the wafer.

DETAILED DESCRIPTION OF THE PREFERRED EMBODIMENTS

The following describes implementations of the present invention by using specific embodiments. A person skilled in the art may easily understand other advantages and effects of the present invention from the content disclosed in this specification. The present invention may also be implemented or applied through other different specific implementations. Various details in this specification may also be modified or changed based on different viewpoints and applications without departing from the spirit of the present invention. For example, during detailed description of the embodiments of the present invention, for ease of description, a cross-sectional view representing an apparatus structure is not enlarged partially according to a general proportion, and the schematic diagram is merely an example, which should not limit the protection scope of the present invention herein. In addition, the three-dimensional space dimensions of a length, a width, and a depth should be comprised in the actual manufacturing.

For ease of description, spatial relationship terms such as "under", "below", "lower", "underneath", "above", and "on" may be used herein to describe a relationship between one element or feature and another element or feature shown in the drawings. It will be understood that the spatial relationship terms are intended to comprise other directions than the directions described in the drawings of the apparatus in use or operation. In addition, when a layer is referred to as being "between" two layers, the layer may be the only layer between the two layers or may be one or more layers between the two layers.

In the context of this application, a described structure in which a first feature is "above" a second feature may comprise an embodiment in which the first feature is in direct contact with the second feature, or may comprise an embodiment in which another feature is formed between the first feature and the second feature. In this way, the first feature may not be in direct contact with the second feature.

It should be noted that, the drawings provided in the embodiments only exemplify the basic idea of the present invention. Although only the components related to the present invention are shown in the drawings, and are not drawn according to the quantities, shapes, and sizes of the components during actual implementation, during actual implementation, the patterns, quantities, and proportions of the components may be randomly changed, and the layout pattern of the components may be more complicated.

For a problem that it is difficult for an existing CVD apparatus to obtain a high-quality deposited thin film with good uniformity on a surface of a wafer, this embodiment provides a reciprocating rotary CVD apparatus and a method for applying same. During thin film deposition, a rotating apparatus rotates, to improve the uniformity of thin film deposition in a circumferential direction of a wafer; the wafer is rotated in a reciprocating manner within an optimal angle range through accurate control of a rotational speed, a rotation direction, and a rotation angle, and the reciprocating rotation angle is limited to be not more than 360°, to achieve the optimal thin film deposition uniformity; and through the reciprocating rotation of the rotating apparatus, the problems of electrical connection and cooling connection during rotation can be effectively resolved, and simple and reliable electrical connection and cooling connection are implemented. According to the reciprocating rotary CVD apparatus and the method for applying same in this embodiment, a problem of non-uniform thin film deposition caused by design, manufacturing, mounting, and debugging of a reaction cavity may be compensated. Therefore, the design of the reaction cavity may be further simplified, and the manufacture/mounting/maintenance may become relatively easy, thereby improving the thin film deposition uniformity and further reducing the apparatus and wafer manufacturing costs.

Referring to FIG. 1 to FIG. 6, this embodiment provides a reciprocating rotary CVD apparatus, comprising: a cavity 101, a wafer heating base 102, and a rotating apparatus. The wafer heating base 102 is located in the cavity 101 and is configured to bear a wafer 300; the rotating apparatus is located outside the cavity 101 and comprises a rotating power mechanism and a rotating sealing mechanism 202, and the rotating sealing mechanism 202 comprises a rotating member 2021 and a fixed member 2022; the fixed member 2022 is fixedly and hermetically connected to the cavity 101, the rotating member 2021 is fixedly and hermetically connected to the wafer heating base 102, the rotating member 2021 is movably and hermetically connected to the fixed member 2022, and the rotating member 2021 is connected to the rotating power mechanism, to drive, by using the rotating power mechanism, the rotating member 2021 and the wafer heating base 102 to perform reciprocating rotation.

As an example, the wafer heating base 102 comprises an internal cooling channel (not shown in the figure), and a cooling material introduced into the internal cooling channel comprises a cooling gas or a cooling liquid.

Figure 1:
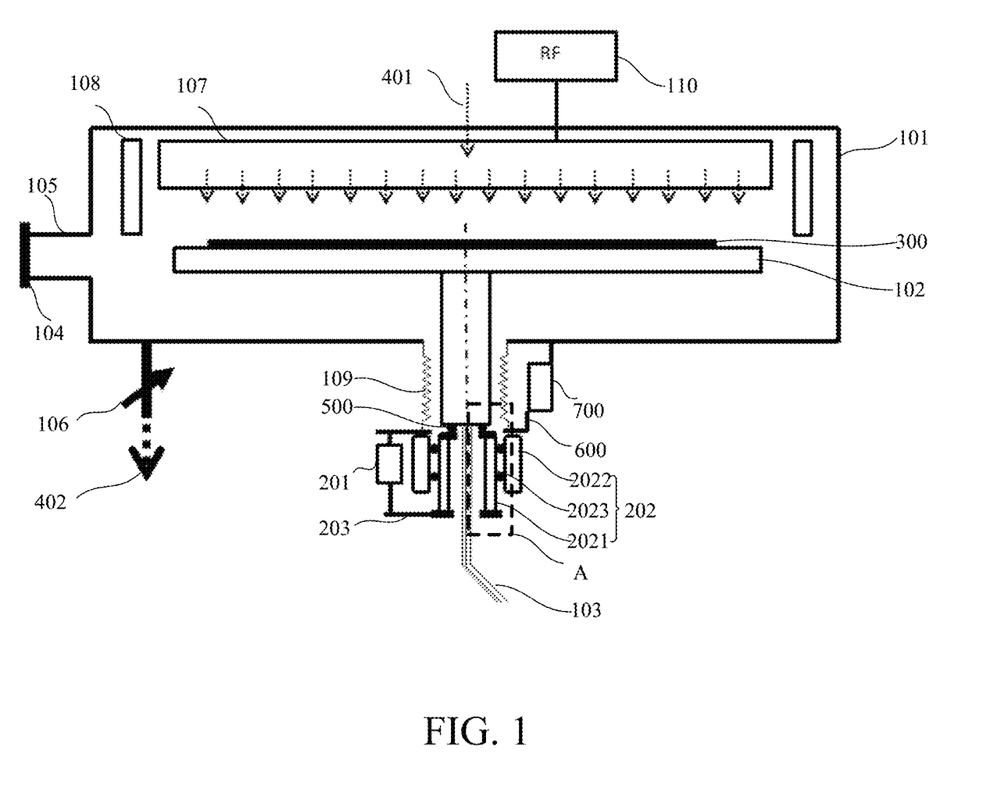
FIG. 1 is a schematic structural diagram of a reciprocating rotary CVD apparatus according to an embodiment.

Specifically, referring to FIG. 1, because thin film deposition or thin film growth needs to be performed at a particular high temperature, the wafer heating base 102 has a heating function. The bottom of the wafer heating base 102 is fixedly and hermetically connected to the rotating member 2021 by a sealing ring 500, to facilitate mounting and removing of the wafer heating base 102. To improve sealing reliability of the bottom of the wafer heating base 102, the wafer heating base 102 preferably has a cooling function, that is, the wafer heating base 102 comprises the internal cooling channel, and a cooling material introduced into the internal cooling channel may comprise, for example, a cooling gas or a cooling liquid such as compressed air, liquid nitrogen, helium gas, cooling water, or alcohol-type cooling liquid, to reduce an action temperature of the sealing ring 500, thereby prolonging the service life of the sealing ring 500, and improving a sealing effect. To reduce the costs and improve the convenience of operations, in this embodiment, the cooling material adopts the cooling water, but is not limited thereto.

A component inside the wafer heating base 102 needs to be connected to a supply line 103, so that the component inside the wafer heating base is connected to a corresponding component outside the cavity 101 by the supply line 103. The supply line 103 may comprise a power line for supplying power to a heater of the wafer heating base 102, a connecting line of a temperature measurement thermocouple for measuring a temperature, a ground line, a water pipe for improving the sealing reliability of the bottom of the wafer heating base 102, a gas pipe for adsorbing the wafer 300 or for cooling, and the like. The supply line 103 may be led out from the bottom of the wafer heating base 102 or an external connecting socket (not shown in the figure) of the supply line 103 may be mounted at the bottom of the wafer heating base 102. A type and a mounting manner of the supply line 103 may be selected according to specific requirements.

The cavity 101 is configured to provide a vacuum sealing reaction cavity for performing thin film deposition. A channel valve 104 and a wafer transfer channel 105 is disposed on the cavity 101, to transfer the wafer 300 through the channel valve 104 and the wafer transfer channel 105. A quantity and distribution of the channel valves 104 and the wafer transfer channels 105 are not excessively limited herein and may be set as required. A chemical reactive gas 401 related to a material of a deposited thin film is inputted from the top of the reaction cavity. To control and adjust the reactive gas 401, the reactive gas 401 is adjusted and controlled preferably by using a flow controller (not shown in the figure), but is not limited thereto. To improve the uniformity of the reactive gas 401 acting on a surface of the wafer 300, a gas uniforming apparatus 107 is preferably disposed in the cavity 101, so that the reactive gas 401 may uniformly flow to the surface of the wafer 300, to form a uniform thin film on the surface of the wafer 300. The reactive gas 401 after participating in the reaction and materials such as by-products generated during the reaction are discharged from a gas exhaust channel (not shown in the figure) disposed on a side surface or the bottom of the cavity 101 by using a vacuum pump (not shown in the figure), and a pressure regulating valve such as a throttle valve 106 for regulating pressure is preferably disposed between the gas exhaust channel and the vacuum pump, to control the speed of gas exhaust by using the throttle valve 106, thereby controlling the pressure in the cavity 101.

Further, to guide gas flow distribution of the reactive gas 401, change a gas flow direction, and prevent the thin film from depositing reactants on a cavity wall of the cavity 101, the cavity 101 is preferably provided with a baffle ring 108 surrounding a side wall of the cavity 101. A shape and a size of the baffle ring 108 may be set as required and are not excessively limited herein.

As an example, the rotating sealing mechanism 202 comprises one of a magnetic fluid rotating sealing mechanism, a magnetic coupling rotating sealing mechanism, and a sealing ring rotating sealing mechanism.

Specifically, in this embodiment, the rotating sealing mechanism 202 adopts a magnetic fluid rotating sealing mechanism, but is not limited thereto. For example, when a rotational speed is relatively low, the magnetic fluid rotating sealing mechanism may be also replaced with a simpler sealing ring rotating sealing mechanism, but the sealing ring rotating sealing mechanism has a problem of wear and a vacuum degree is not easily ensured. Alternatively, the magnetic fluid rotating sealing mechanism may be replaced with a magnetic coupling rotating sealing mechanism having a higher vacuum degree, but the magnetic coupling rotating sealing mechanism has a complex structure and a large volume. Therefore, a specific type of the rotating sealing mechanism 202 may be selected according to process requirements, and is not excessively limited herein.

As an example, the rotating member 2021 is movably connected to the fixed member 2022 by a bearing 2023, and the bearing 2023 comprises a radial bearing 20231 and an end face bearing 20232.

Figure 2:
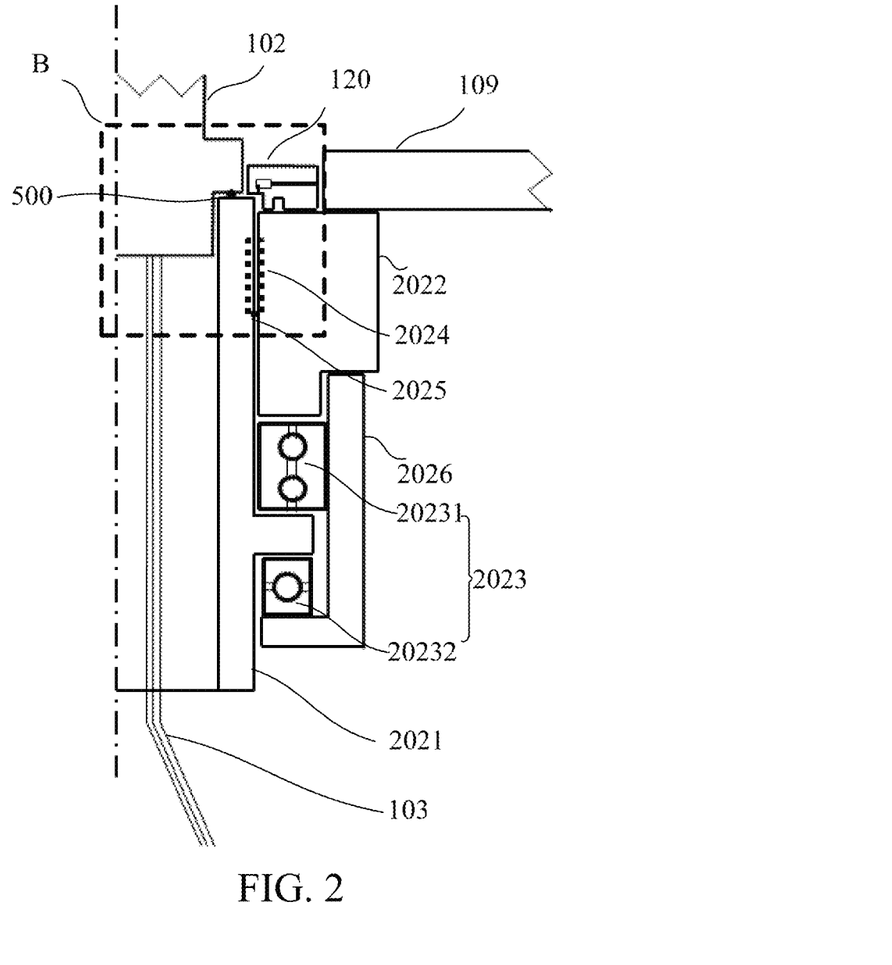
FIG. 2 is a partially enlarged schematic structural diagram of a region A in FIG. 1

Specifically, FIG. 2 is a partially enlarged schematic structural diagram of a region A in FIG. 1. The magnetic fluid rotating sealing mechanism comprises the rotating member 2021 and the fixed member 2022 that have a concentric axis, the rotating member 2021 is movably connected to the fixed member 2022 by the radial bearing 20231 and the end face bearing 20232, the rotating member 2021, the fixed member 2022, and a bearing 2023 are fixedly connected by a fixed member support portion 2026, and the rotating member 2021 may perform relative rotation around the concentric axis by using the bearing 2023. Through combination of two different forms of the radial bearing 20231 and the end face bearing 20232, concentricity and a supporting capability of the rotating member 2021 and the fixed member 2022 may be further ensured, and precise and reliable relative rotation is performed, so that the rotating member 2021 can rotate freely under the driving of the rotating power mechanism. A gap 2025 is designed between the rotating member 2021 and the fixed member 2022, to ensure that the rotating member 2021 is not in contact with the fixed member 2022 during rotation, thereby avoiding friction or getting in stuck. However, the gap 2025 is in communication with the inside and the outside of the cavity 101, and therefore, the gap needs to be sealed. Because a magnetic fluid 2024 has reliable sealing performance, a relatively high vacuum degree can be achieved, and when the rotational speed is relatively high or is relatively low, reliable sealing can be achieved, and the requirements of a CVD apparatus for the vacuum degree can be completely met. Therefore, the gap 2025 can be well sealed by injecting the magnetic fluid 2024, but a specific structure and a sealing manner of the rotating sealing mechanism 202 are not limited thereto.

Figure 3:
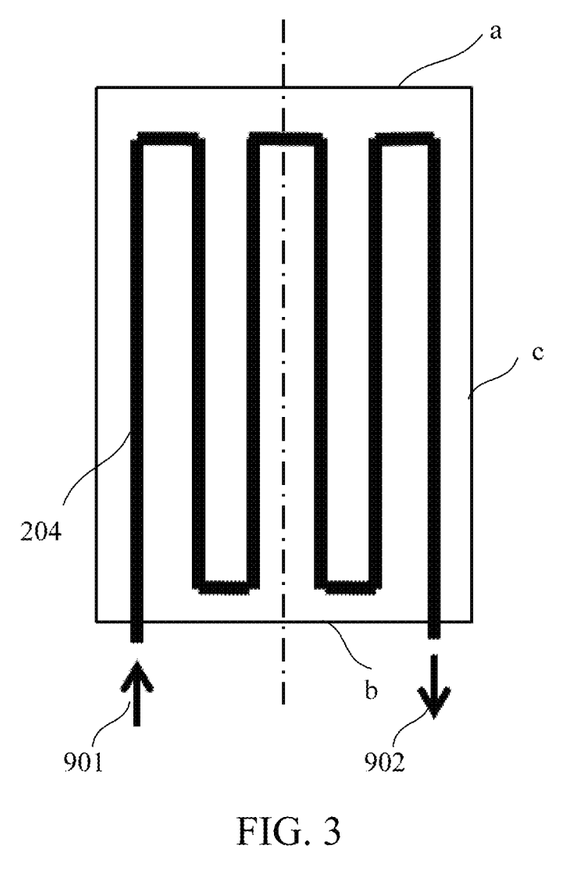
FIG. 3 is a schematic structural diagram of an internal cooling channel in a rotating member.

As an example, the rotating member 2021 comprises a first end a, a second end b, and a side wall c located between the first end a and the second end b, and the rotating member 2021 comprises an internal cooling channel 204, where the first end a is fixedly and hermetically connected to the wafer heating base 102, an inlet 901 and an outlet 902 of the internal cooling channel 204 are located at the second end b, and the internal cooling channel covers the first end a and the side wall c; and a cooling material introduced into the internal cooling channel 204 comprises a cooling gas or a cooling liquid.

Specifically, referring to FIG. 3, because the first end a of the rotating member 2021 is fixedly and hermetically connected to the wafer heating base 102 by the sealing ring 500, heat of the wafer heating base 102 is conducted to the rotating member 2021. Therefore, after the internal cooling channel 204 covering the first end a is disposed in the rotating member 2021, a temperature of the rotating member 2021 may be further reduced by using the cooling material, to improve a sealing effect of the sealing ring 500, and reduce the loss of the sealing ring 500, thereby reducing the costs. Further, the magnetic fluid 2024 needs to work within a particular temperature range, and a temperature cannot exceed an upper limit. Therefore, after the internal cooling channel 204 covering the side wall c is disposed in the rotating member 2021, the temperature of the rotating member 2021 may be reduced by using the cooling material, to ensure a normal working temperature of the magnetic fluid 2024. The cooling material may adopt, for example, compressed air, liquid nitrogen, helium gas, cooling water, or alcohol-type cooling liquid. To reduce the costs and improve the convenience of operations, in this embodiment, the cooling material adopts the cooling water, but is not limited thereto. The internal cooling channel 204 preferably adopts a coiled pipe, so that both the first end a and the side wall c are covered by the internal cooling channel 204, and further preferably, a temperature of the cooling material is −30° C. to 100° C. such as 10° C., 20° C., or 30° C., to achieve a good sealing effect. A specific temperature may be set and selected as required.

As an example, the reciprocating rotary CVD apparatus further comprises a purge gas guide ring 120 located in the cavity 101, a slit channel 130 is formed between the purge gas guide ring 120 and the wafer heating base 102, a range of a width W of the slit channel 130 is greater than 0 mm and less than or equal to 1 mm, a range of a length L of the slit channel is greater than or equal to 5 mm, and a purge exhaust gas 802 passing from the purge gas guide ring 120 to the cavity 101 through the rotating sealing mechanism 202 and the slit channel 130 is provided by using the purge gas guide ring 120.

Figure 4:
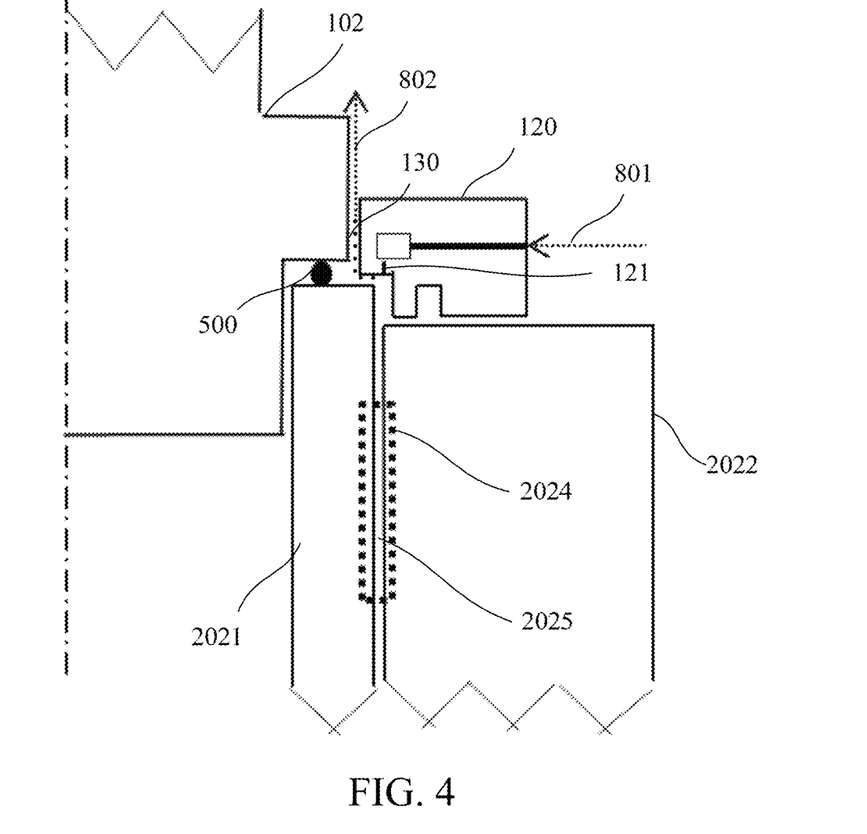
FIG. 4 is a partially enlarged schematic structural diagram of a region B in FIG. 2.

Specifically, an atmospheric pressure difference may be formed by using the purge gas guide ring 120, to ensure that a purge entering gas 801 entering the purge gas guide ring 120 passes through the rotating sealing mechanism 202 and the slit channel 130 to form a purge exhaust gas 802 exiting the slit channel 130, and then the purge gas is blown to the cavity 101, so that an isolation channel may be further formed by using the purge exhaust gas 802 and the slit channel 130, to prevent a foreign material such as the magnetic fluid 2024 from entering the cavity 101. Referring to FIG. 2 and FIG. 4, the magnetic fluid 2024 is used for vacuum sealing and is directly exposed to the atmosphere of the cavity 101, and the magnetic fluid 2024 may be effectively prevented from being in contact with the reactive gas 401 for chemical reaction in the cavity 101 by using the purge gas guide ring 120. The purge gas guide ring 120 may be fixed to the fixed member 2022, the reactive gas 401 in the cavity 101 is isolated from the magnetic fluid 2024 by using the purge exhaust gas 802, and an inert gas such as N2 or He is preferably selected for the purge entering gas 801. Specifically, the appropriate purge entering gas 801 may be selected according to different CVD process requirements, to prevent the purge exhaust gas 802 sprayed out of the slit channel 130 from being mixed with the reactive gas 401 after entering the cavity 101, affecting the quality of the deposited thin film. Preferably, a range of the width W of the slit channel 130 is greater than 0 mm and less than or equal to 1 mm, for example, 0.5 mm or 0.8 mm. A range of the length L of the slit channel 130 is greater than or equal to 5 mm, for example, 6 mm or 10 mm, to satisfy design requirements and provide the purge exhaust gas 802 that is uniformly distributed. In this embodiment, the width W=0.5 mm and the length L=5 mm of the slit channel 130 are not limited thereto, and may be selected as required.

Further, the purge gas guide ring 120 comprises uniform gas holes 121, and the uniform gas holes 121 are uniformly distributed, so that the purge entering gas 801 is uniformly distributed in a circumferential direction and flows out. Preferably, the uniform gas holes 121 and the gap 2025 between the rotating member 2021 and the fixed member 2022 are located on the same vertical line.

Specifically, FIG. 4 is a partially enlarged schematic structural diagram of a region B in FIG. 2. To uniformly blow out the purge entering gas 801, the uniform gas holes 121 are designed. The purge entering gas 801 enters an annular groove from an interface, and the bottom of the groove is provided with a plurality of uniformly distributed uniform gas holes 121, to achieve a throttling function by using the uniform gas holes 121, so that the purge entering gas 801 flows out in a uniform distribution manner, to form a uniformly distributed purge exhaust gas 802. A pressure difference is formed by using the purge exhaust gas 802, to form a barrier, which prevents foreign materials from entering the cavity 101, and prevents the magnetic fluid 2024 from being in contact with the reactive gas 401 in the cavity 101. When the uniform gas holes 121 and the gap 2025 are preferably located on the same vertical line, the isolation effect can be further improved. The shapes and distribution of the uniform gas holes 121 are not excessively limited herein and may be set as required.

As an example, the reciprocating rotary CVD apparatus further comprises a bellows 109 hermetically connected to the cavity 101 and the fixed member 2022 and a lifting power mechanism 700 located outside the cavity 101 and fixedly connected to the fixed member 2022, where the lifting power mechanism 700 comprises a driving motor and a transmission connecting member (not shown in the figure), and the driving motor comprises a servomotor.

Figure 6:
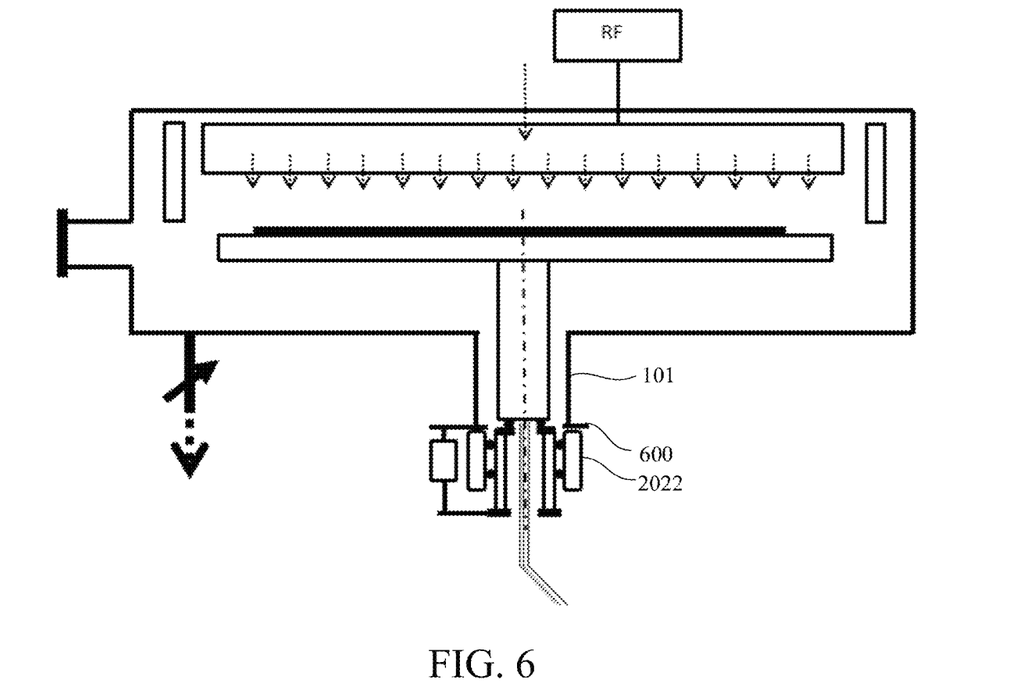
FIG. 6 is a schematic structural diagram of another reciprocating rotary CVD apparatus according to an embodiment.

Specifically, FIG. 1 and FIG. 6 are schematic structural diagrams of two reciprocating rotary CVD apparatuses in this embodiment. A difference between the two reciprocating rotary CVD apparatuses mainly lies in that the reciprocating rotary CVD apparatus in FIG. 1 comprises the bellows 109 and the lifting power mechanism 700, and lifting and falling of the wafer heating base 102 is implemented by using the bellows 109 and the lifting power mechanism 700, to adjust a height of the wafer 300, but is not limited thereto. As shown in FIG. 6, when a height of the wafer heating base 102 of the reciprocating rotary CVD apparatus is fixed, the bellows 109 and the lifting power mechanism 700 may be removed. In this case, the fixed member 2022 may be directly mounted on the cavity 101 by using a flange 600.

As an example, the rotating power mechanism comprises a driving motor 201 and a transmission connecting member 203, the driving motor 201 comprises a servomotor, and the transmission connecting member 203 comprises a belt or gear.

Specifically, in this embodiment, the fixed member 2022 is fixed to the lifting power mechanism 700 by using the flange 600, the lifting power mechanism 700 is fixed to the cavity 101, and the rotating member 2021 is in transmission connection to the driving motor 201 through the belt or the gear, and is driven by the driving motor 201 to rotate. Because the wafer heating base 102 is fixedly and hermetically connected to the rotating member 2021 by the sealing ring 500, the operation of the wafer heating base 102 may be driven by using the driving motor 201. In this embodiment, the driving motor 201 is preferably the servomotor, to accurately control a rotation direction, a rotational speed, a position of an angle of arrival, or the like of the wafer heating base 102, but is not limited thereto.

As an example, a range of an angle θ by which the wafer heating base 102 performs reciprocating rotation is greater than 0° and less than or equal to 360°, and θ preferably comprises 90°, 180°, and 360°. A rotation angle of the wafer heating base 102 is limited within 360°, which is implemented by an electromechanical apparatus mounted on the driving motor 201 and an electromechanical apparatus on the rotating member 2021, to ensure that the apparatus operates in a normal rotation range. The specific embodiments defining the rotation range are not described in detail herein.

Figure 5:
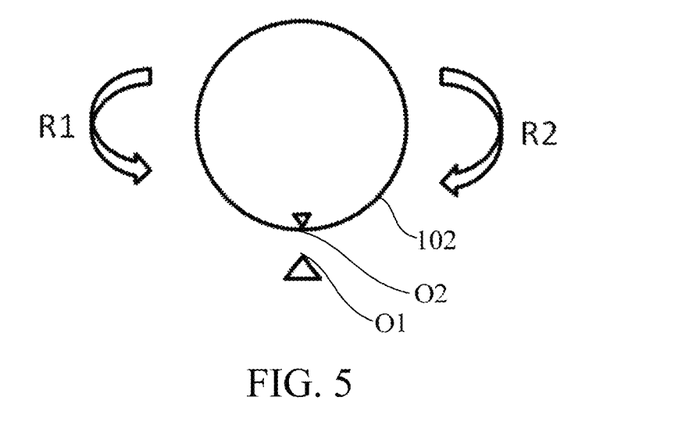
FIG. 5 is a schematic diagram in which a reciprocating rotary CVD apparatus performs reciprocating rotation according to an embodiment.

Specifically, referring to FIG. 5, in an actual thin film deposition application, an angle by which the wafer heating base 102 performs reciprocating rotation needs to be selected according to a design condition of the cavity 101, for example, the angle θ by which the wafer heating base 102 performs the reciprocating rotation may be 90°, 180°, 270°, 360°, or any angle θ within a range less than 360°. Because the angle θ is selectable and adjustable, a user may determine a range of an optimal rotation angle θ according to characteristics of the apparatus and characteristics of each thin film deposition process, to achieve the optimal thin film uniformity, and may select one or more times of reciprocating rotation during thin film deposition and determine an optimal quantity of times of reciprocating rotation, to achieve the optimal thin film uniformity, and may also change a relative angle position of the wafer 300 and the wafer heating base 102 during thin film deposition, to achieve the optimal thin film deposition uniformity.

As an example, a manner in which the wafer heating base 102 performs the reciprocating rotation comprises: clockwise rotating R2 by an angle θ from a starting position, and then counterclockwise rotating R1 by the angle θ, to return to the starting position; or counterclockwise rotating R1 by an angle θ from a starting position, and then clockwise rotating R2 by the angle θ, to return to the starting position, and a rotational speed during the reciprocating rotation is an independently controlled speed.

Specifically, referring to FIG. 5, a reference point O2 of the wafer heating base starts operation with a reference point O1 as a starting position, and the wafer heating base may rotate in either a clockwise rotation R2 manner or a counterclockwise rotation R1 manner. Both rotation directions are identical in the effect of improving the thin film deposition uniformity, and therefore, the wafer heating base can rotate in a reciprocating manner without limitation on the rotation direction. Secondly, according to requirements, a range of a quantity of times M of reciprocating rotation may be greater than or equal to 1, for example, 10 times, 20 times, or 100 times. This is not limited herein. Because the wafer heating base 102 is not rotated continuously, the supply line 103 is not wound due to the rotation. Therefore, sliding contact type electrical connection may be prevented from being added to the electrical connection and the rotary cooling pipe joint connection may be prevented from being added to the cooling channel connection.

As an example, a manner in which the wafer heating base 102 performs the reciprocating rotation the comprises: clockwise rotating by an angle θ1 from a starting position, then counterclockwise rotating by an angle θ2, and returning to the starting position through reciprocating rotation for N times, N being greater than or equal to 1; or counterclockwise rotating by an angle θ1 from a starting position, then clockwise rotating by an angle θ2, and returning to the starting position through reciprocating rotation for N times, N being greater than or equal to 1, and a rotational speed during the reciprocating rotation is an independently controlled speed.

Specifically, when θ1 is equal to θ2, that is, reciprocating rotation is performed for N=1 time, to return to the starting position, and details are not described herein again. When θ1 is not equal to θ2, the wafer heating base 102 may rotate clockwise R2 from the starting position by the angle θ1, then rotate counterclockwise R1 by the angle θ2, then rotate clockwise R2 by the angle θ2 again, and then rotate counterclockwise R1 by the angle θ1, to return to the starting position through reciprocating rotation for N=2 times, but is not limited thereto. For example, a value of N may be set to 3, 4, 5, 10, or the like as required, to complete one reciprocating cycle operation from the starting position to the starting position. A specific operation manner may be selected as required. A rotational speed during the reciprocating rotation may be independently controlled by using a controller or the like, so as to have different operating speeds, thereby further improving the uniformity and quality of the deposited thin film and expanding the application range of the reciprocating rotary CVD apparatus.

As an example, the reciprocating rotary CVD apparatus comprises one of plasma-enhanced chemical vapor deposition (PECVD), sub-atmospheric chemical vapor deposition (SACVD), low-pressure chemical vapor deposition (LPCVD), and metal-organic chemical vapor deposition (MOCVD).

This embodiment further provides a method for applying a reciprocating rotary CVD apparatus, specifically comprising:
providing the reciprocating rotary CVD apparatus; and
placing a wafer 300 on the wafer heating base 102, and performing synchronous reciprocating rotation on the wafer 300 and the wafer heating base 102, to perform thin film deposition, where a specific operation step is not described herein again.

This embodiment further provides a method for applying a reciprocating rotary CVD apparatus. A difference from the method for applying same is that the wafer 300 and the wafer heating base 102 perform synchronous reciprocating rotation as required, and an angle correspondence between the wafer 300 and the wafer heating base 102 is changed during the thin film deposition. The method specifically comprises:
providing the reciprocating rotary CVD apparatus; and
placing a wafer 300 on the wafer heating base 102, and performing synchronous reciprocating rotation on the wafer 300 and the wafer heating base 102, to perform thin film deposition;
during the thin film deposition, stopping the reciprocating rotation, separating the wafer 300 and the wafer heating base 102, rotating the wafer heating base 102 by an angle φ, and placing the wafer 300 back onto the wafer heating base 102, so that the wafer 300 and the wafer heating base 102 deflect relative to each other by the angle φ, where a range of the angle φ is greater than 0° and less than or equal to 360°; and
continuously performing reciprocating rotation on the heating base, and continuously performing the thin film deposition.

Figure 7:
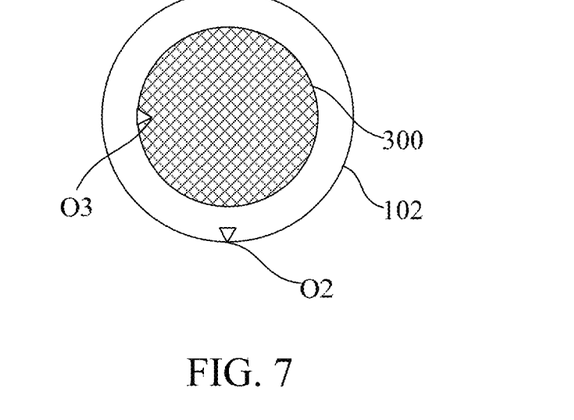
FIG. 7 is a schematic structural diagram of a position relationship between a wafer and a wafer heating base according to an embodiment.
Figure 8:
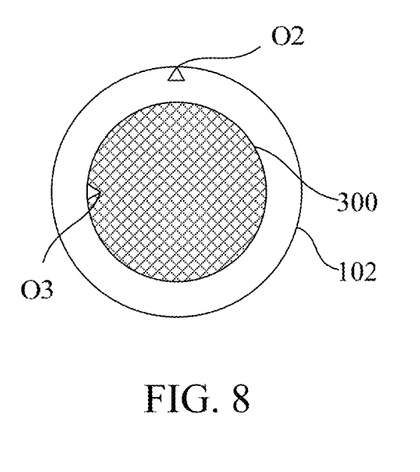
FIG. 8 is a schematic structural diagram of a position relationship after a wafer and a wafer heating base deflect relative to each other by an angle (p in FIG. 7.

Specifically, referring to FIG. 7 and FIG. 8, during thin film deposition, because the wafer heating base 102 has a heating function, the temperature of the wafer heating base 102 is not uniform, resulting in non-uniform temperature distribution of the wafer 300. A relative angle of the wafer 300 placed on the wafer heating base 102 is changed by rotating the wafer heating base 102 by an angle (p alone, so that the relative position in which the temperature of the wafer 300 is non-uniformly distributed is changed. Referring to FIG. 7 to FIG. 8, a wafer reference point O3 is always at 9 o'clock, a reference point O2 of the wafer heating base may be at 6 o'clock, the wafer 300 may be removed to separate the wafer 300 from the wafer heating base 102 when a part of thin film deposition is completed. The wafer heating base 102 may be controlled to rotate by 180° as required, and the reference point O2 of the wafer heating base is at 12 o'clock, so that the wafer 300 and the wafer heating base 102 deflect relative to each other by the angle φ. In this case, the wafer 300 is then placed on the wafer heating base 102 to complete the remaining thin film deposition. Therefore, the relative angle of the wafer 300 and the wafer heating base 102 is changed, to compensate the impact generated by the non-uniform temperature of the wafer 300 and the like caused by the non-uniform temperature of the wafer heating base 102 and the like. A common relative angle of rotation may comprise, for example, 900 or 180°, but is not limited to a particular quantity of times and a particular angle and speed.

Specifically, in this embodiment, the reciprocating rotary CVD apparatus is preferably a PECVD apparatus which is widely used, but is not limited thereto, and the reciprocating rotary CVD apparatus may be alternatively a CVD apparatus such as SACVD, LPCVD, or MOCVD in which the wafer 300 is placed on the wafer heating base 102 for thin film deposition.

Based on the foregoing, according to the reciprocating rotary CVD apparatus and the method for applying same consistent with the present invention, a rotating apparatus is comprised. During thin film deposition, the rotating apparatus rotates, to improve the uniformity of thin film deposition in a circumferential direction of a wafer; the wafer is rotated in a reciprocating manner within an optimal angle range through accurate control of a rotational speed, a rotation direction, and a rotation angle, and the reciprocating rotation angle is limited to be not more than 360°, to achieve the optimal thin film deposition uniformity; and through the reciprocating rotation of the rotating apparatus, the problems of electrical connection and cooling connection during rotation can be effectively resolved, and simple and reliable electrical connection and cooling connection are implemented.

According to the reciprocating rotary CVD apparatus and the method for applying same consistent with the present invention, a problem of non-uniform thin film deposition caused by design, manufacturing, mounting, debugging, and the like of a reaction cavity may be compensated, the design of the reaction cavity may be further simplified, and the manufacture/mounting/maintenance may become relatively easy, thereby improving the thin film deposition uniformity and further reducing the apparatus and manufacturing costs.

The above embodiments only exemplarily illustrate the principles and effects of the present invention, but are not used to limit the invention. A person skilled in the art can modify or change the above embodiments without departing from the spirit and scope of the present invention. Therefore, all equivalent modifications or changes made by a person of ordinary skill in the art without departing from the spirit and technical idea of the present invention shall be covered by the claims of the present invention.

What is claimed is:

1. A reciprocating rotary chemical vapor deposition (CVD) apparatus, comprising:
a cavity (101) for performing thin film deposition in a vacuum cavity;
a wafer heating base (102) for performing a reciprocating rotation comprising: clockwise rotating by an angle θ1 from a starting position, then counterclockwise rotating by an angle θ2, and returning to the starting position through reciprocating rotations for N times, N being greater than or equal to 1; or counterclockwise rotating by an angle θ1 from a starting position, then clockwise rotating by an angle θ2, and returning to the starting position through reciprocating rotations for N times, N being greater than or equal to 1; and the rotational speed during the reciprocating rotation is independently controlled;

a rotating member (2021), bearings (2023), and a member (2022) that is hermetically connected to the cavity (101), the rotating member (2021) is fixedly and hermetically connected to the wafer heating base (102), the rotating member (2021) is movably and hermetically connected to the member (2022) that is hermetically connected to the cavity (101), and the rotating member (2021) is connected to a driving motor (201) through belts or gears, the driving motor (201) drives the rotating member (2021) and the wafer heating base (102) to perform reciprocating rotation;

a gap (2025) disposed between the rotating member (2021) and the member (2022) that is hermetically connected to the cavity (101) is filled with a magnetic fluid (2024);

a purge gas guide ring (120) located in the cavity (101), a slit channel (130) is formed between the purge gas guide ring (120) and the wafer heating base (102), a range of a width W of the slit channel (130) is greater than 0 mm and less than or equal to 1 mm, a range of a length L of the slit channel (130) is greater than or equal to 5 mm, and a purge gas passing from the purge gas guide ring (120) to the cavity (101) through the rotating sealing mechanism (202);

a sealing ring (500) located between the bottom of the wafer heating base (102) and the rotating member (2021);

a supply line (103) is led out from the bottom of the wafer heating base.

2. The reciprocating rotary CVD apparatus as in claim 1, wherein the rotating member (2021) is movably connected to a fixed member support portion (2026) by the bearings (2023), and the bearings (2023) comprise a radial bearing (20231) and an end face bearing (20232).

3. The reciprocating rotary CVD apparatus as in claim 1, wherein the rotating member (2021) comprises a first end a, a second end b, and a side wall c located between the first end a and the second end b, and the rotating member (2021) comprises an internal cooling channel (204), wherein the first end a is fixedly and hermetically connected to the wafer heating base (102), an inlet (901) and an outlet (902) of the internal cooling channel (204) are located at the second end b, and the internal cooling channel (204) covers the first end and the side wall c; and a cooling material introduced into the internal cooling channel (204) comprises cooling gas or cooling liquid.

4. The reciprocating rotary CVD apparatus as in claim 1, wherein the purge gas guide ring (120) further comprises uniform gas holes (121), and the uniform gas holes (121) are uniformly distributed, so that the purge gas flows out and is uniformly distributed in a circumferential direction.

5. The reciprocating rotary CVD apparatus as in claim 1, further comprising a bellows (109) hermetically connected to the cavity (101) and the member (2022) that is hermetically connected to the cavity (101) and a lifting power mechanism (700) for adjusting a height of the wafer (300) located outside the cavity (101) and fixedly connected to the member (2022) that is hermetically connected to the cavity (101).

6. The reciprocating rotary CVD apparatus as in any one of claim 1, comprising one of plasma-enhanced chemical vapor deposition (PECVD), sub-atmospheric chemical vapor deposition (SACVD), low-pressure chemical vapor deposition (LPCVD), and metal-organic chemical vapor deposition (MOCVD).

7. The reciprocating rotary CVD apparatus as in claim 1, wherein the uniform gas holes (121) and the gap (2025) are located on the same vertical line.

\* \* \* \* \*